United States Patent
Babcock et al.

(10) Patent No.: US 7,422,829 B1
(45) Date of Patent: Sep. 9, 2008

(54) OPTICAL PROXIMITY CORRECTION (OPC) TECHNIQUE TO COMPENSATE FOR FLARE

(75) Inventors: Carl P. Babcock, Campbell, CA (US); Jongwook Kye, Pleasanton, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 570 days.

(21) Appl. No.: 10/859,276

(22) Filed: Jun. 2, 2004

(51) Int. Cl.
*G03F 1/00* (2006.01)
*G06F 17/20* (2006.01)

(52) U.S. Cl. .......................... 430/5; 716/21
(58) Field of Classification Search ............ 430/5, 430/394; 716/19–21
See application file for complete search history.

(56) References Cited

U.S. PATENT DOCUMENTS 6,989,229 B2 * 1/2006 Lucas et al. ............. 430/311
7,097,945 B2 * 8/2006 Chang et al. ............. 430/5
2004/0196447 A1 * 10/2004 Watanabe ................ 355/77

* cited by examiner

*Primary Examiner*—Stephen Rosasco
(74) *Attorney, Agent, or Firm*—Renner, Otto, Boisselle & Sklar, LLP

(57) ABSTRACT

A method of adjusting a reticle layout to correct for flare can include determining a localized reticle pattern density across the reticle layout and determining a relationship between reticle pattern density and edge adjustment for the photolithography apparatus being used. For a given feature of the reticle layout, an edge of the feature can be adjusted by a given amount based on the localized reticle pattern density adjacent the given feature. This method allows for a rule-based optical proximity correction (OPC) approach to compensate for long-range and short-range flare within a photolithography apparatus.

20 Claims, 9 Drawing Sheets

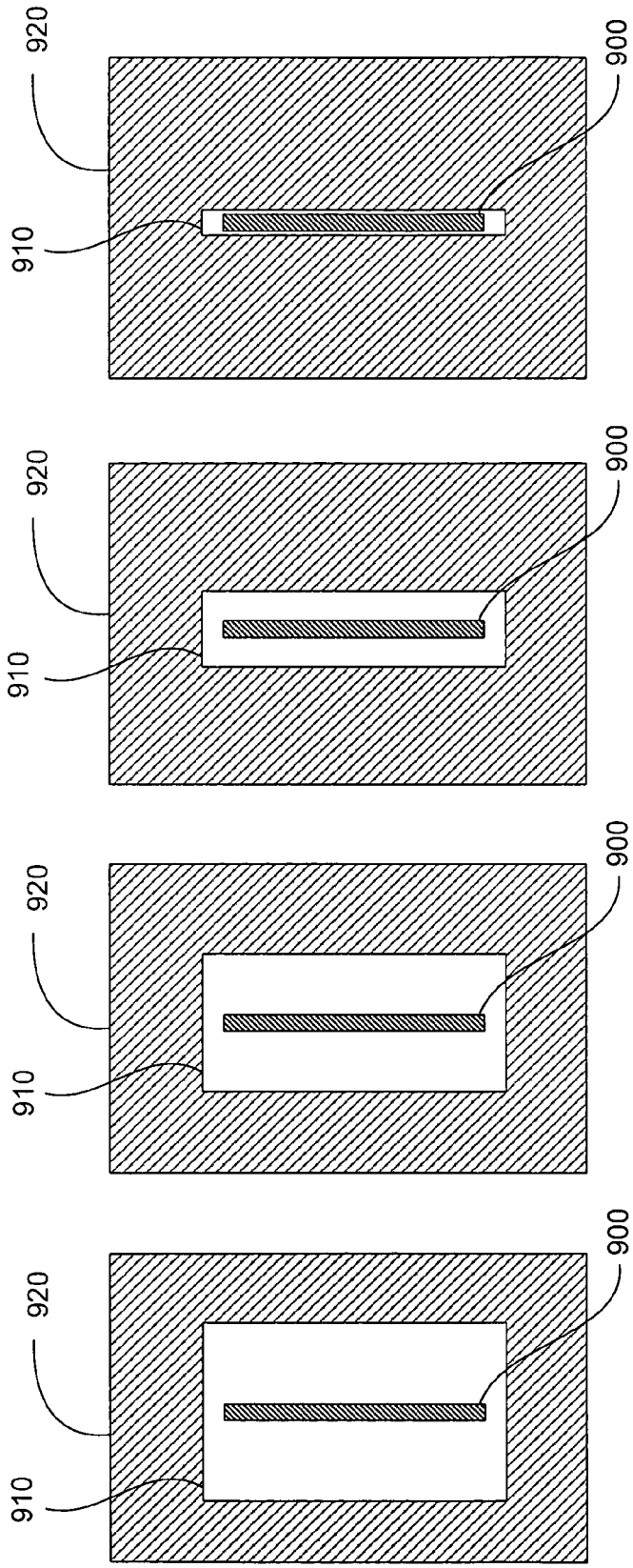

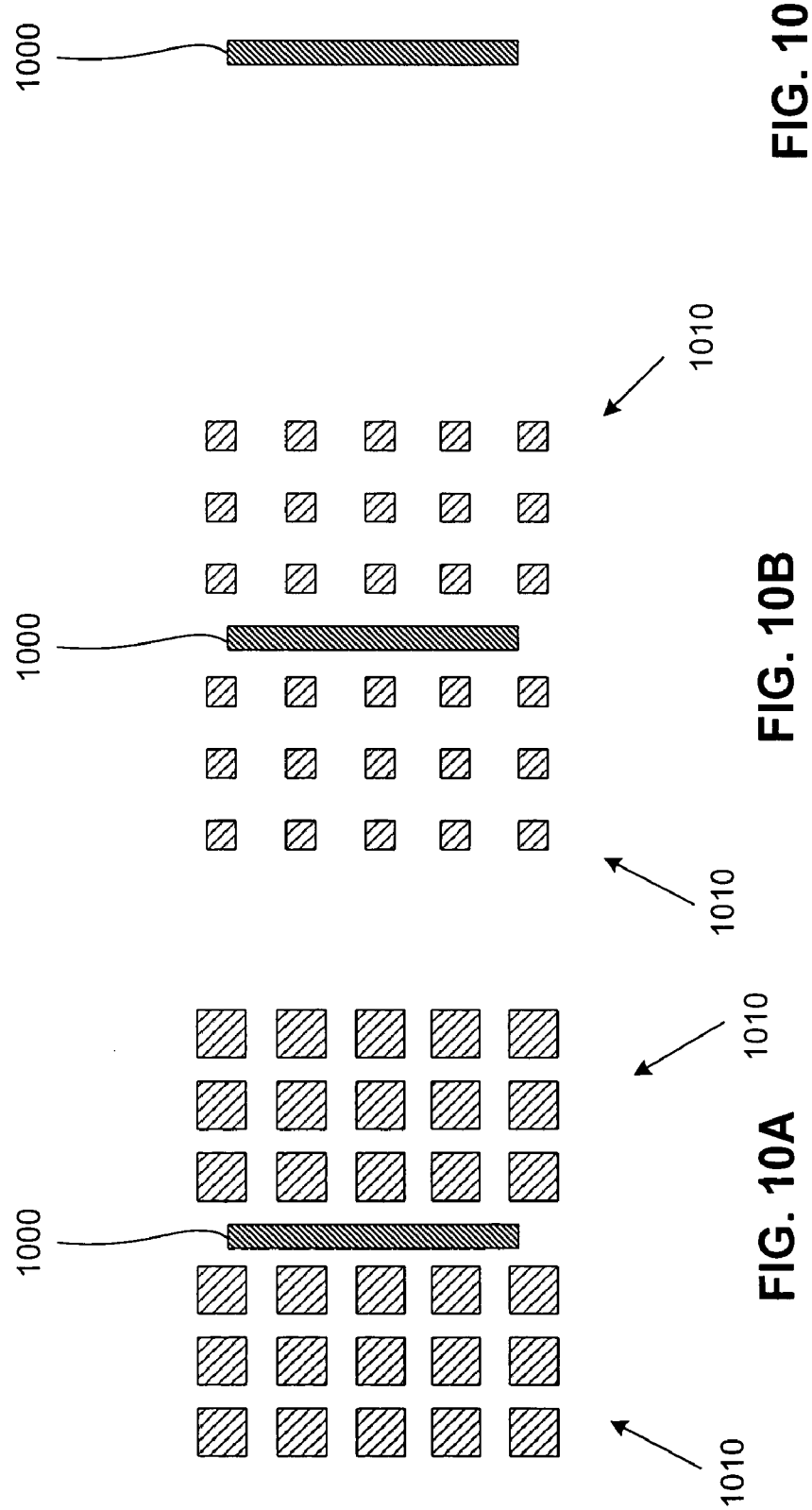

OPTICAL PROXIMITY CORRECTION (OPC) TECHNIQUE TO COMPENSATE FOR FLARE

TECHNICAL FIELD

The present invention relates generally to the field of integrated circuit device design and manufacture and, more particularly, to a method of correcting a photolithographic pattern layout using an optical proximity correction (OPC) technique that compensates for flare.

BACKGROUND

Optical lithography or photolithography has been widely used in the semiconductor industry in connection with the formation of a wide range of structures present in integrated circuit (IC) devices. The photolithography process generally begins with the formation of a photoresist layer on or over the top surface of a semiconductor substrate or wafer (or some intermediate layer). A reticle or mask having fully light non-transmissive opaque regions, which are often formed of chrome, and fully light transmissive clear regions, which are often formed of quartz, is positioned over the photoresist-coated wafer.

The mask is placed between a radiation or light source, which produces light of a pre-selected wavelength (e.g., ultraviolet light) and geometry, and an optical lens system, which may form part of a stepper or scanner apparatus. When light from the light source is directed onto the mask, the light is focused to generate a reduced mask image on the wafer, typically using the optical lens system, which contains one or several lenses, filters, and/or mirrors. The light passes through the clear regions of the mask to expose the underlying photoresist layer and is blocked by the opaque regions of the mask, leaving that underlying portion of the photoresist layer unexposed. The exposed photoresist layer can then be developed, typically through chemical removal of the exposed or unexposed regions of the photoresist layer. The end result is a semiconductor wafer coated with a photoresist layer exhibiting a desired pattern, which defines geometries, features, lines and shapes of that layer. This pattern can then be used for etching underlying regions of the wafer. geometries, features, lines and shapes of that layer. This pattern can then be used for etching underlying regions of the wafer.

There is a pervasive trend in the art of IC device design and fabrication to increase the density with which various structures are arranged and manufactured. As such, minimum line widths (often referred to as critical dimension (CD)), separations between lines, and pitch are becoming increasingly smaller. For example, nodes having a CD of about 45 nanometers (nm) to about 65 nm have been proposed. In the submicron processes employed to achieve devices of this scale, silicon yield is affected by factors such as reticle/mask pattern fidelity, optical proximity effects and photoresist processing. Some of the more prevalent concerns include line end pull-back, corner rounding and line width variations. These concerns are largely dependent on local pattern density and topology.

Optical proximity correction (OPC) has been used to improve image fidelity. In general, current OPC techniques involve running a computer simulation that takes an initial data set, having information related to the desired pattern or layout, and manipulates the data set to arrive at a corrected data set in an attempt to compensate for the above-mentioned concerns. Briefly, the OPC process can be governed by a set of geometric rules (i.e., "rule-based OPC" employing fixed rules for geometric manipulation of the data set), a set of modeling principles (i.e., "model-based OPC" employing predetermined behavior data to drive geometric manipulation of the data set) or a hybrid combination of rule-based OPC and model-based OPC.

The computer simulation can involve iteratively refining the data set using, for example, an edge placement error value as a benchmark for the compensating process. That is, the data set can be manipulated based on the rules and/or models and the predicted placement of the edges contained in the pattern can be compared against their desired placement. For each edge, or segment thereof depending on how the edges are fragmented in the data set, a determination of how far the predicted edge/segment placement deviates from the desired location is derived. For instance, if the predicted edge placement corresponds to the desired location, the edge placement error for that edge will be zero.

While conventional OPC techniques have been effective for generating OPC edge movements to correct for proximity effects and other manufacturability concerns, these OPC techniques have been based on a simulation that does not include or otherwise take into account scattered light within the photolithography apparatus or scanner. However, all scanners produce undesirable scattered light that reaches the image plane, which is commonly referred to as flare. Flare can lead to several deleterious effects, such as degraded image contrast and CD variation.

Accordingly, a need exists in the art for an improved OPC technique that compensates for flare.

SUMMARY OF THE INVENTION

According to one aspect of the invention, the invention is directed to a method of adjusting a reticle layout to compensate for flare. The method can include determining a localized reticle pattern density across the reticle layout and determining a relationship between reticle pattern density and edge adjustment. For a given feature of the reticle layout, an edge of the feature can be adjusted by a given amount based on the localized reticle pattern density adjacent the given feature.

According to another aspect of the invention, the invention is directed to a program embodied in a computer-readable medium to correct a reticle layout topology for flare. The program can include code that determines a localized reticle pattern density across the reticle layout and code that determines a relationship between reticle pattern density and edge adjustment. The program can further include code that, for a given feature of the reticle layout, adjusts an edge of the feature by a given amount based on the localized reticle pattern density adjacent the given feature.

These and other features of the invention are fully described and particularly pointed out in the claims. The following description and annexed drawings set forth in detail certain illustrative embodiments of the invention, these embodiments being indicative of but a few of the various ways in which the principles of the invention may be employed.

BRIEF DESCRIPTION OF DRAWINGS

These and further features of the present invention will be apparent with reference to the following description and drawings, wherein:

FIGS. 9A-9D are schematic diagrams illustrating a methodology for determining CD change as a function of scattered light intensity in accordance with one embodiment of the present invention; and FIGS. 10A-10C are schematic diagrams illustrating a methodology for determining CD change as a function of scattered light intensity in accordance with another embodiment of the present invention.

DISCLOSURE OF INVENTION

Figure 1:
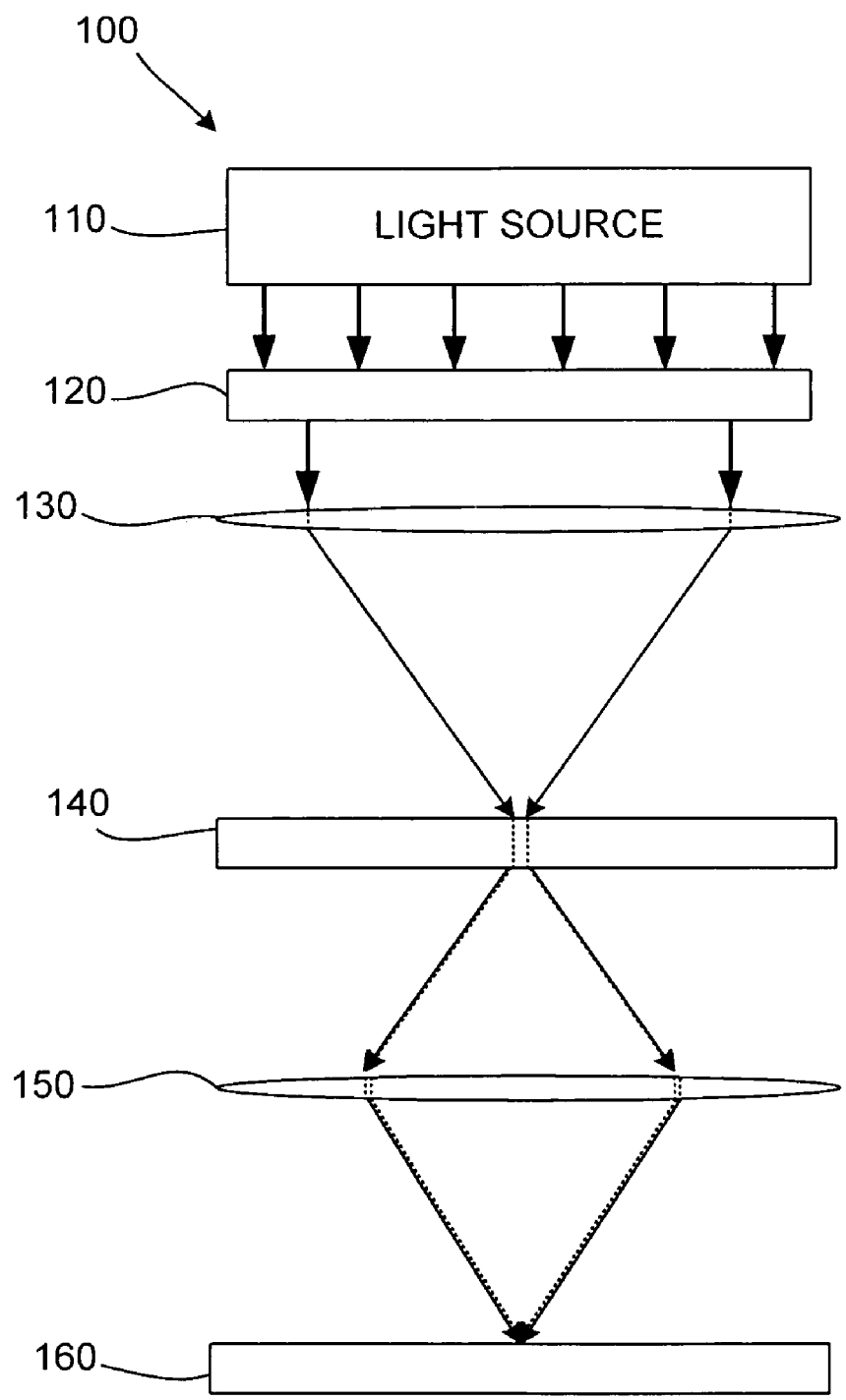
FIG. 1 is a schematic diagram of an exemplary photolithographic apparatus for patterning wafers with reticle data corrected in accordance with the present invention.

In the detailed description that follows, corresponding components have been given the same reference numerals regardless of whether they are shown in different embodiments of the present invention. To illustrate the present invention in a clear and concise manner, the drawings may not necessarily be to scale and certain features may be shown in somewhat schematic form.

One aspect of the present invention includes a method of correcting or otherwise adjusting a reticle layout pattern to compensate for flare using an optical proximity correction (OPC) simulation tool. The OPC simulation tool can use rule-based and/or model-based correction techniques to modify the reticle layout pattern for layout on a mask (or reticle) used in photolithographic processing of an IC wafer. The method of correcting the reticle layout can include determining a localized pattern density across the reticle field and determining a relationship between pattern density and edge adjustment. For a given edge or feature of the reticle layout, the edge of the feature can be adjusted by a given amount based on the average pattern density adjacent the given edge or feature.

The present invention will be described herein in the exemplary context of the design, layout generation and manufacturing processes for ultimately patterning a semiconductor layer (e.g., polysilicon) that forms a part of an IC device. Exemplary IC devices can include general use processors made from thousands or millions of transistors, a flash memory array, SRAM (static random-access memory) cells or any other dedicated circuitry. However, one skilled in the art will appreciate that the methods and systems described herein can also be applied to the design process and/or manufacture of any article manufactured using photolithography, such as micromachines, disk drive heads, gene chips, micro-electro-mechanical systems (MEMS) and the like.

With reference to FIG. 1, an exemplary photolithography apparatus 100 (sometimes referred to as a scanner) for manufacturing or otherwise processing IC devices is provided. The photolithography apparatus 100 can include a light source 110, which illuminates an aperture plate 120. The light source 110 can include any suitable light source, such as an excimer laser, providing light at a wavelength of 248 nm, 193 nm or 157 nm, using, for example, a KrF source, a ArF source, a $F_2$ source, etc. The light source can produce light having a wavelength in the ultraviolet (UV), vacuum ultraviolet (VUV), deep ultraviolet (DUV) or extreme ultraviolet (EUV) range. In one embodiment, the aperture plate 120 can include any aperture geometry that provides off-axis illumination, including, but not limited to dipole illumination, quadrupole illumination, double-dipole illumination and annular illumination. Alternatively, another off-axis illumination generating means, such as a suitable diffractive optical element, can be employed.

Light or other actinic energy passing through the aperture plate 120 can be condensed or otherwise focused by a lens system 130 onto a mask or reticle 140 having a desired layout pattern thereon. In one embodiment, the mask 140 can include a transmissive binary mask having a chrome pattern etched on a quartz substrate. However, it is to be appreciated that other masks, such as reflective masks, phase-shifting masks, attenuated or otherwise, and the like, can be employed in order to provide off-axis illumination. At least the $0^{th}$ and $1^{st}$ order diffraction components of the light passed by the mask 140 can be focused by a lens system 150 onto a target 160, such as a photoresist-coated substrate or wafer.

As is described more fully below, the photolithography apparatus or scanner 100 can produce or otherwise include varying amounts of scattered light that unintentionally reaches or otherwise falls on the image plane or wafer. For purposes of this discussion, such scattered light that unintentionally reaches the wafer plane will be referred to as "flare". It is to be appreciated that flare can include light reflected or scatter by one or both of the lens systems 130, 150. In addition, some scattering can be caused by imperfections in one or more of the lens systems 130, 150 as well as scattering in the color centers of one or both of the lens systems 130, 150. In addition, light may reflect off of the reticle 140 (i.e., off either or both of the chrome portions and/or quartz portions of the reticle). The above-described reflections and/or scatterings can cause multiple reflections within the scanner, thereby resulting in scattered light reaching the image plane and causing defects, such as degraded image contrast, critical dimension (CD), variation and the like.

Figure 2:
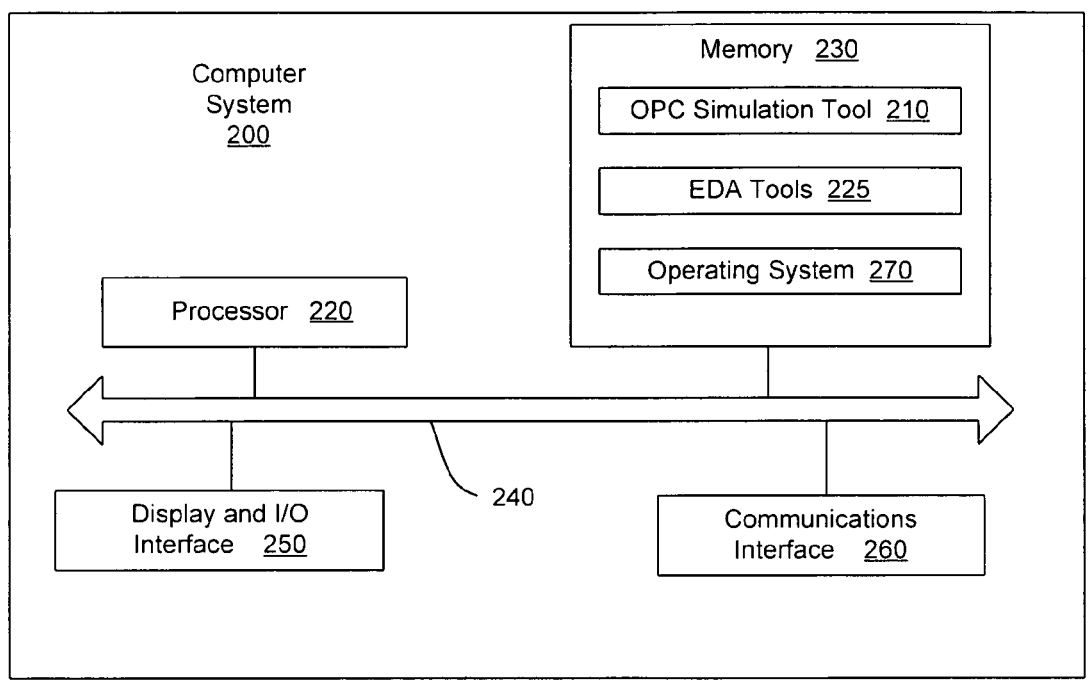
FIG. 2 is a schematic block diagram of a computer system capable of executing an optical proximity correction (OPC) simulation tool in accordance with the present invention.

Turning now to FIG. 2, a schematic block diagram of a computer system 200 capable of executing an OPC simulation tool 210 in accordance with the present invention as well as other design processes using electronic design automation (EDA) tools 225 is illustrated. As indicated, the OPC simulation tool 210 can be used to iteratively make adjustments to a reticle layout to account for variations or distortions caused by flare. While the present invention is being discussed with respect to OPC techniques to compensate for unwanted scattered light or flare, it is to be appreciated that the OPC simulation tool 210 can also be used to iteratively make adjustments to a reticle layout, using one or more appropriate figures of merit (FOM), to account for other variations and/or distortions, such as optical distortions caused by the pattern itself (e.g., optical interference, diffraction, etc.). In one embodiment, the simulation tool 210 is embodied as a computer program (e.g., a software application including a compilation of executable code).

To execute the OPC simulation tool 210, the computer system 200 can include one or more processors 220 used to execute instructions that carry out a specified logic routine. In addition, the computer system 200 can include a memory 230 for storing data, software, logic routine instructions, computer programs, files, operating system instructions, and the like. The memory 230 can comprise several devices and includes, for example, volatile and non-volatile memory components. As used herein, the memory 230 can include, for example, random access memory (RAM), read-only memory (ROM), hard disks, floppy disks, compact disks (e.g., CD-ROM, DVD-ROM, CD-RW, etc.), tapes, and/or other memory components, plus associated drives and players for these memory types. The processor 220 and the memory 230 are coupled using a local interface 240. The local interface 240 can be, for example, a data bus, accompanying control bus, a network, or other subsystem.

The computer system 200 can include various video and input/output interfaces 250 as well as one or more communications interfaces 260. The interfaces 250 can be used to couple the computer system 200 to various peripherals and networked devices, such as a display (e.g., a CRT display or LCD display), a keyboard, a mouse, a microphone, a camera, a scanner, a printer, a speaker, and so forth. The communications interfaces 260 can be comprised of, for example, a modem and/or network interface card, and can enable the computer system 200 to send and receive data signals, voice signals, video signals, and the like via an external network, such as the Internet, a wide area network (WAN), a local area network (LAN), direct data link, or similar wired or wireless system.

The memory 230 can store an operating system 270 that is executed by the processor 220 to control the allocation and usage of resources in the computer system 200. Specifically, the operating system 270 controls the allocation and usage of the memory 230, the processing time of a processor 220 dedicated to various applications being executed by the processor 220, and the peripheral devices, as well as performing other functionality. In this manner, the operating system 270 serves as the foundation on which applications, such as the OPC simulation tool 210, depend, as is generally known by those of ordinary skill in the art.

Figure 3:
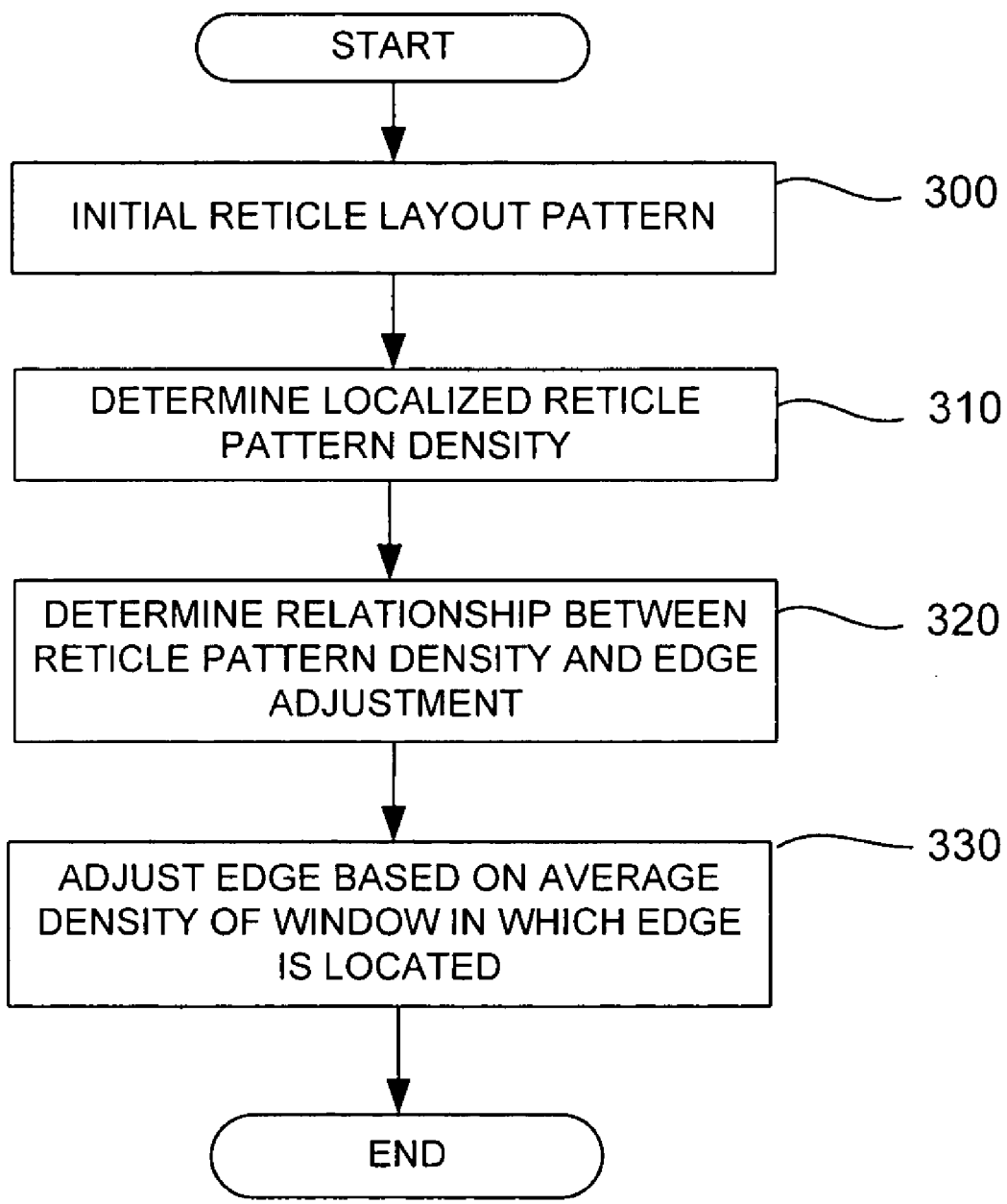
FIG. 3 is a flow chart illustrating a method of correcting for critical dimension (CD) variation due to flare in accordance with one embodiment of the present invention.
Figure 4A:
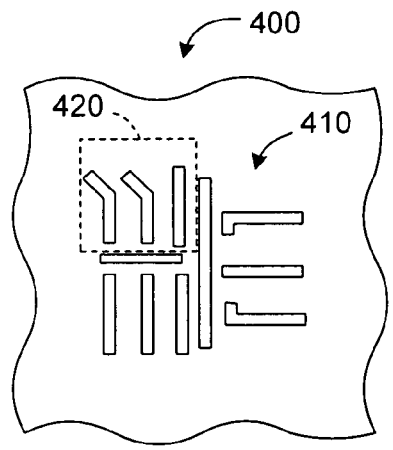
FIGS. 4A-4F are schematic diagrams illustrating a methodology for determining localized pattern density across a reticle layout pattern.
Figure 4B:
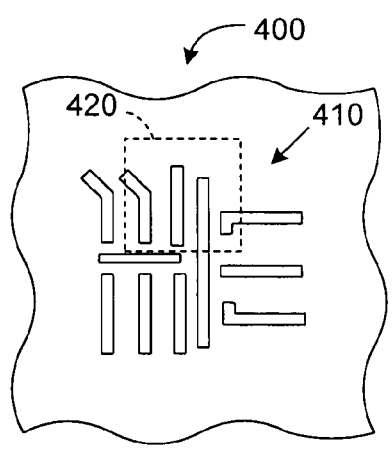
Figure 4C:
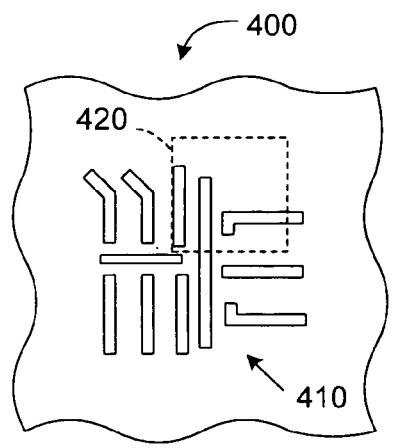
Figure 4D:
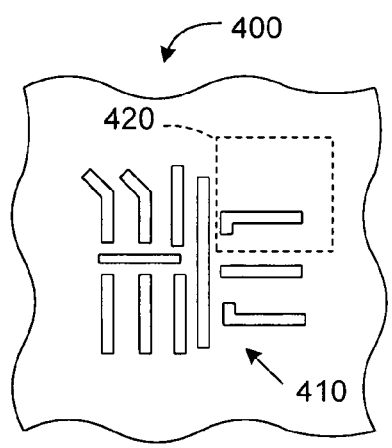
Figure 4E:
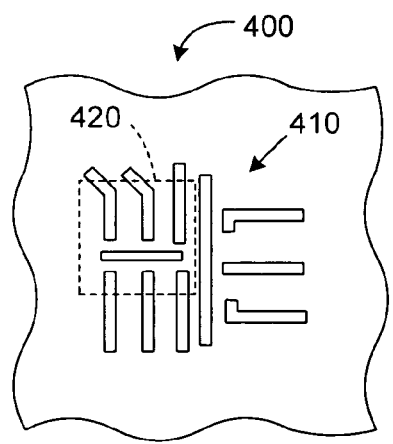
Figure 4F:
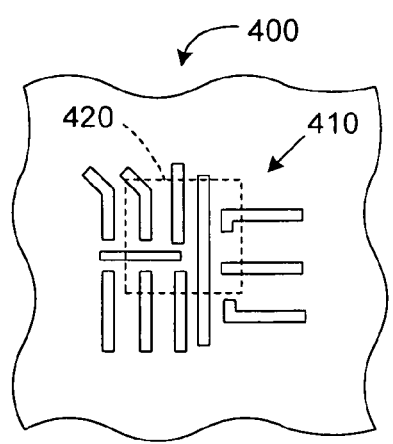

With reference now to FIG. 3, one embodiment of a method of correcting or otherwise adjusting a reticle layout to compensate for flare is provided. The flow chart of FIG. 3 can be thought of as depicting steps of a method implemented on or with the assistance of the computer system 200 of FIG. 2.

The method, as specified by the OPC simulation tool 210, can begin at step 300 with a beginning or initial reticle layout corresponding to a desired topology of an IC layer provided in the form of a data set (also referred to as a target database). Typical formats for the shapes of a layout data set or target database include GDS II and CIF. As will become clear through the following description, the OPC simulation tool 210 acts on this topographical data set to assist in the design or production of a final reticle layout that will be used to achieve the desired IC layer topology through the photolithographic process.

In one embodiment, the data set can include geometrical representations of the structures to be formed on the wafer from a layer of material, including layout information regarding the size and relative position of each structure. For example, if the layer is to be used to form polysilicon gate electrodes, the data set can include a plurality of rectangles (and other polygons) with location information such that, upon ultimate formation of the gate electrodes, the gate electrodes are formed over a substrate of the wafer in locations to define corresponding channels between a source and a drain of each device.

At step 310, a localized reticle layout or pattern density can be determined. In one embodiment, this includes logically stepping across the entire reticle pattern and calculating average pattern densities (also referred to as optical densities) within a sampling window of a given size (also referred to as an optical radius). As is described more fully below, the size of the sampling window can be determined and/or varied depending upon the flare characteristics associated with the particular scanner.

With additional reference to FIGS. 4A-4F, schematic illustrations of an exemplary reticle space 400 are provided. The exemplary reticle space 400 includes a portion of a reticle layout or pattern 410. For purposes of this discussion, the exemplary reticle space 400 and reticle layout or pattern 410 (and the OPC adjustments thereto) will be described in connection with a clear-field mask or reticle. An exemplary clear-field mask can include a binary mask in which the layout pattern is dark (typically formed of chrome) and the field region outside of the pattern is clear (typically corresponding to a quartz substrate). However, it is to be appreciated that the methodology described herein is also applicable to dark-field masks (where the field region is dark and the pattern defined therein is clear).

In one embodiment, the localized density of the reticle pattern 410 can be calculated or otherwise determined (step 310) by logically stepping or scanning a sampling window 420 across the reticle pattern 410 along one or both directions (e.g., along the x-direction and along the y-direction) and calculating or otherwise determining the average reticle pattern density within the sampling window at a number of positions across the reticle field. For example, sampling of the localized reticle pattern density can begin with the sampling window 420 in a first position (illustrated in FIG. 4A) and continue with the sampling window 420 stepped across the reticle pattern 410 (e.g., along the x-direction) to a second position (illustrated in FIG. 4B) and on to a third position and fourth position (illustrated in FIGS. 4C and 4D, respectively).

At each position or location within the reticle field, the density of pattern coverage (also referred to as optical density) within the sampling window can be calculated or otherwise determined using, for example, a suitable geometric engine or software tool. Such software tools are understood by those skilled in the art and, therefore, will not be described here in greater detail.

The sampling window illustrated in FIGS. 4A-4F has a square geometry. However, it is to be appreciated that other sampling window sizes and geometries (e.g., a circle, an ellipse, etc.) can be employed without departing from the scope of the present invention. As is described more fully below, the size and shape of the sampling window, as well as the step size between successive samplings, can be determined or otherwise selected based on the scale of the reticle pattern as well as characteristics of the flare associated with the particular scanner being employed in the photolithographic processing. In one embodiment, the ratio between the width or diameter of the sampling window (depending upon sampling window geometry) and the step size between successive samplings can have a ratio of about 2:1 to about 10:1. For example, in one embodiment, the step size between successive samplings may be about 2 microns, while the size of the sampling window may be about 5 microns. In another exemplary embodiment, the step size between successive samplings may be about 1 micron, while the size of the sampling window may be about 5 microns.

At each sampling position within the reticle field, the average pattern density within the sampling window and the coordinates or position of the center of the sampling window can be recorded. Sampling of the entire reticle field can result in a localized reticle pattern density map, such that, for any given coordinate (or edge) the average pattern density can be provided for use in determining the appropriate OPC edge adjustment to compensate for flare. For example, it can be seen that the average reticle pattern density is considerably greater within the sampling window at the position illustrated in FIG. 4A than it is at the position illustrated in FIG. 4D.

With continued reference to FIG. 3, step 320 can include determining a relationship between reticle pattern density and edge adjustment. It is to be appreciated that the relationship between reticle pattern density and edge adjustment can also be thought of in terms of a relationship between reticle pattern density and CD variation. The relationship between reticle pattern density and edge adjustment (or CD variation) can be thought of as including a relationship between reticle pattern density and scattered light intensity and a relationship between scattered light intensity and edge adjustment (or CD variation). As is described more fully below, the relationship between reticle pattern density and edge adjustment (or CD variation) can be determined experimentally by manipulating the optical density around a feature having a given CD and determining the variation or change in the CD as a function of optical density. Alternatively, this relationship can be determined (oftentimes beforehand) using an appropriate simulation tool. The relationship between reticle pattern density and edge adjustment (or CD variation) can be expressed in terms of an appropriate plot and/or a lookup table.

At step 330, one or more edges of features of the reticle pattern can be moved or otherwise adjusted based on the average reticle pattern density of the window(s) in which the particular edge is located. As is described more fully below, this step can be performed iteratively until all edges of the reticle pattern are adjusted to compensate for flare. It is to be appreciated that clear-field features (i.e., dark pattern features on a clear mask) will have their edges moved outward in order to compensate for flare, while dark-field features (i.e., clear pattern features on a dark mask) will have their edges moved inward in order to compensate for flare.

In an alternative embodiment, the methodology described above with reference to FIG. 3, can be carried out by systematically selecting edges of features within the reticle pattern and calculating an average reticle pattern density within a window of predetermined size around the selected edge (rather than creating a map of localized reticle pattern density across the entire reticle field). Each edge can then be adjusted accordingly based on a relationship between reticle pattern density and edge adjustment, as is described above.

Figure 5:
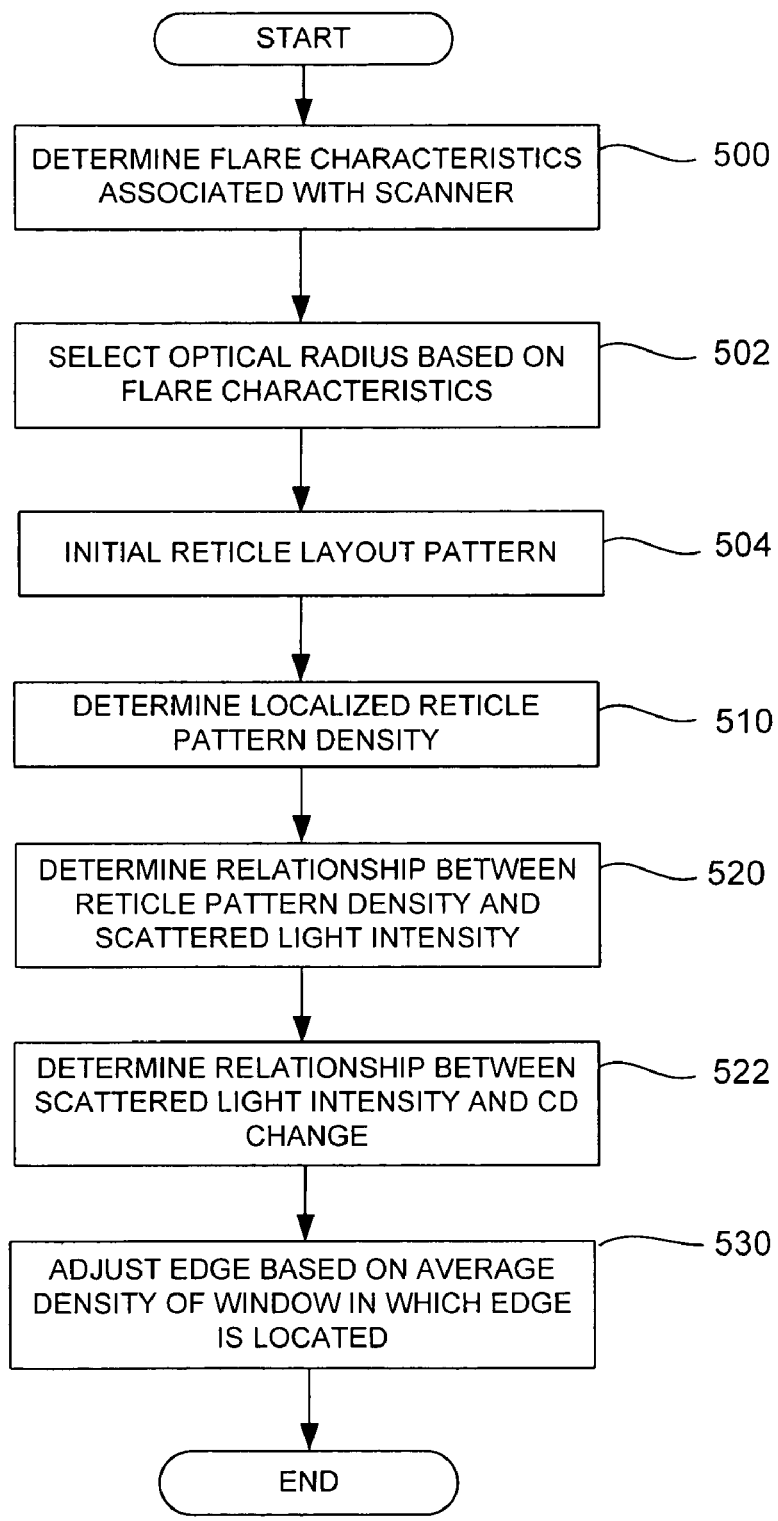
FIG. 5 is a flow chart illustrating a method of correcting for critical dimension (CD) variation due to flare in accordance with one embodiment of the present invention.

With reference now to FIG. 5, one embodiment of a method of correcting or otherwise adjusting a reticle layout to compensate for flare is provided. As discussed above with reference to FIG. 3, the flow chart of FIG. 5 can be thought of as depicting steps of a method implemented on or with the assistance of the computer system 220 of FIG. 2.

The method can begin at step 500, where the flare characteristics associated with the particular scanner can be determined or otherwise characterized. In this manner, it can be determined whether the particular scanner being employed demonstrates shorter range flare, longer range flare or some combination of the two. For purposes of this discussion, shorter range flare can be thought of as scattered light that tapers off within a distance of about 250 nanometers to about 5 microns from a bright area or reticle layout pattern feature. Conversely, longer range flare can be thought of as scattered light that tapers off within a distance of about 5 microns to about 5 millimeters from a bright area or reticle layout pattern feature.

Figure 6:
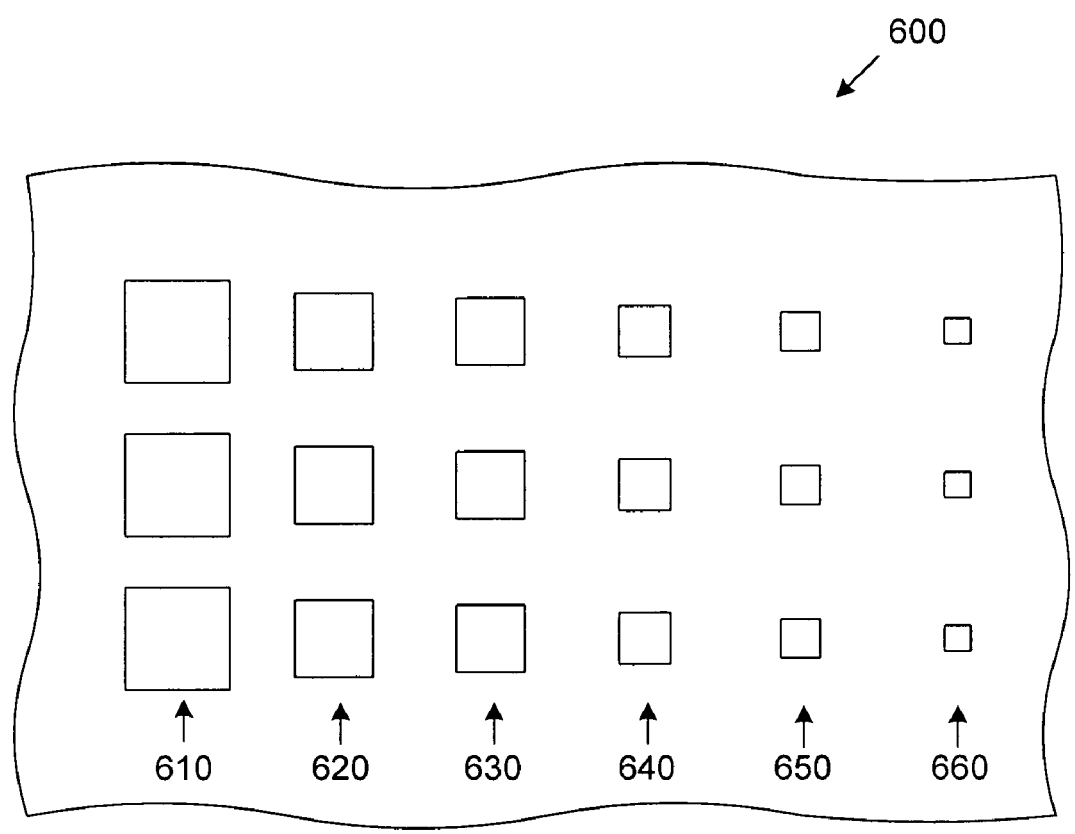
FIG. 6 is a schematic diagram illustrating a methodology for determining a length scale of flare to be corrected for in accordance with the present invention.

FIG. 6 is a schematic diagram illustrating a methodology for determining or otherwise characterizing the length scale of flare for a particular photolithographic scanner. FIG. 6 includes an exemplary test reticle space 600, which includes a plurality of different sized features 610, 620, . . . , 660. While the embodiment illustrated in FIG. 6 includes a plurality of square pads of varying size and density, it is to be appreciated that the test feature 610, 620, . . . , 660 can be of any suitable geometry, including, but not limited to, rectangular, circular and the like. In one embodiment, the reticle test pattern 600 can be exposed to illumination of varying exposures, ranging from the nominal exposure up to and including overexposure. Alternatively, the patterning or printing of the reticle test pattern 600 can be simulated for varying exposures in order to determine or otherwise characterize the flare associated with the particular scanner being employed. In one embodiment, this can be accomplished using the simulation tool 210, such as CALIBRE® by Mentor Graphics Corp. As can be seen from FIG. 6, the test features 610, 620, . . . , 660 are of decreasing size. For each degree of exposure, the pattern 600 can be studied to determine the smallest features that print before being washed away by flare. In this manner, the length scale of the flare can be determined or otherwise characterized.

Once the flare characteristics have been determined at step 500, the optical radius (i.e., the size of the sampling window) can be determined at step 502. For example, if it is determined that the particular scanner being employed exhibits longer range flare, then a sampling window having a larger radius can be selected. Conversely, if it is determined that the scanner being employed exhibits a shorter range flare, a smaller optical radius can be selected for sampling the localized reticle pattern density. In one embodiment, a sampling window of a given size can be stepped across the reticle pattern in one direction (e.g., the x-direction) and a sampling window of a different size can be stepped across the reticle pattern in another direction (e.g., the y-direction).

Once the flare associated with the scanner has been characterized (step 500) and an appropriate optical radius has been selected (step 502), the method can continue at step 504 with a beginning or initial reticle layout corresponding to a desired topology of an IC layer provided in the form of a data set (also referred to as a target database). Typical formats for the shapes of a layout data set or target database include GDS II and CIF. As discussed above, the OPC simulation tool 210 acts on the topographical data set to assist in the design or production of a final reticle layout that will be used to achieve the desired IC layer topology through photolithographic processing.

At step 510, the localized reticle pattern density can be determined. As discussed above with respect to FIGS. 3 and 4, this can include logically stepping or scanning a sampling window of a given size across the entire reticle pattern and calculating average optical densities within the sampling window. As discussed above in connection with step 502, the size of the sampling window or optical radius can be determined and/or varied depending upon whether the particular scanner being employed demonstrates long-range and/or short-range flare characteristics. At each sampling position across the reticle pattern, the average pattern density within the sampling window and the coordinates or position of the center of the sampling window can be recorded, thereby resulting in a localized reticle pattern density map.

Figure 7:
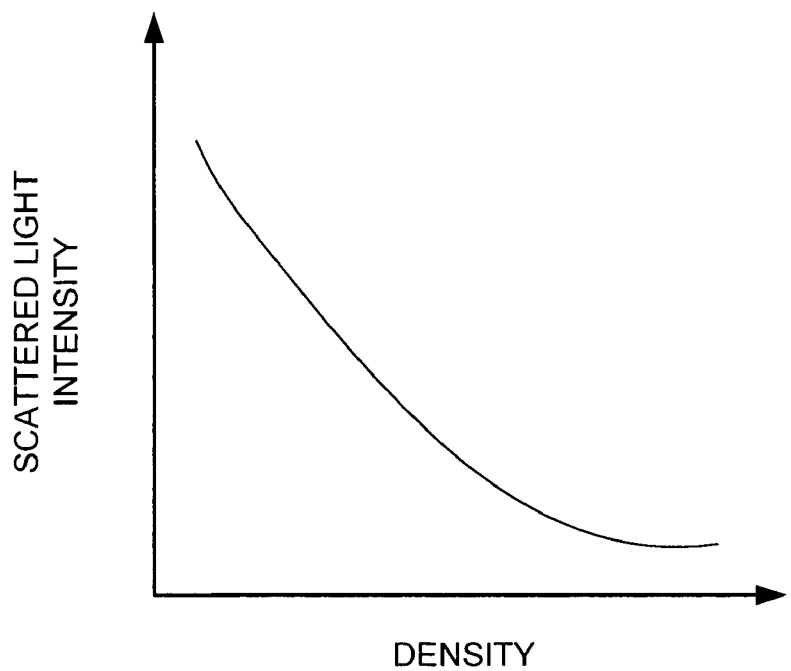
FIG. 7 is an exemplary plot of scattered light intensity versus reticle pattern density for use in accordance with the present invention.

At step 520, the relationship between reticle pattern density and scattered light intensity can be determined. It is to be appreciated that, for the particular scanner being employed, this step can be determined within the sequence illustrated in FIG. 5 or, alternatively, predetermined out of the sequence illustrated in FIG. 5. In one embodiment, the relationship between reticle pattern density and scattered light intensity can be experimentally determined using suitable test patterns of features of varying size and density. It is generally understood that as the density of features increases, the scattered light intensity adjacent thereto decreases, as shown in the exemplary plot of FIG. 7.

Figure 8:
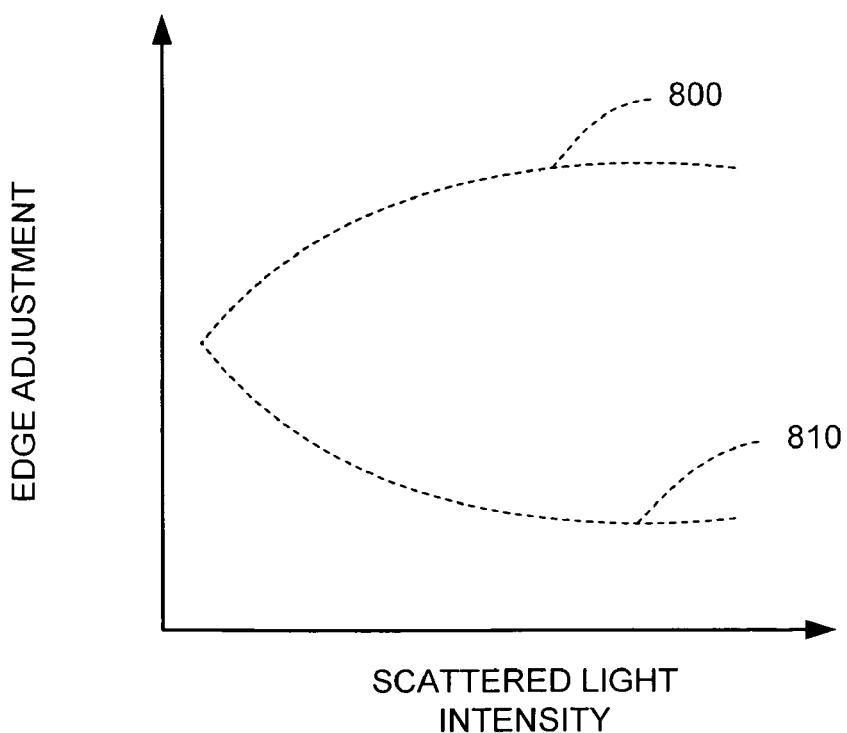
FIG. 8 is an exemplary plot of edge adjustment versus scattered light intensity for use in accordance with the present invention.

At step 522, the relationship between scattered light intensity and CD change can be determined. As discussed above with respect to step 520, step 522 can be performed in the sequence illustrated in FIG. 5. Alternatively, step 522 can be predetermined, thereby providing a lookup table or curve of CD change versus the scattered light intensity. FIG. 8 illustrates an exemplary plot of edge adjustment (to correct for CD change due to flare) as a function of scattered light intensity. It is to be appreciated that FIG. 8 shows two plots 800, 810 demonstrating the relationship between edge adjustment (to correct for CD change due to flare) and scattered light intensity. The upper plot 800 demonstrates this relationship for clear-field features, while the lower plot 810 demonstrates the relationship for dark-field features.

FIGS. 9A-9D and FIGS. 10A-10C schematically illustrate two embodiments for determining a relationship between scattered light intensity and CD change. It is to be appreciated that both of these methodologies involve manipulating optical densities around a feature of a given line width. FIGS. 9A-9D include a line 900 having a line width of approximately the desired CD, which is surrounded by a clear box 910, which is surrounded by a dark box 920. In FIGS. 9A-9D, the optical density around the critical feature 900 is progressively decreased by decreasing the size of the clear box 910. In this manner, the width of the feature 900 or change therein can be experimentally determined as a function of scattered light intensity and/or optical density. It is to be appreciated that the methodology of FIGS. 9A-9D can be employed to determine the relationship between scattered light intensity and CD change for a clear-field feature. This relationship can be determined for a dark-field feature by making dark the portions 900 and 920, while making clear the box 910.

FIGS. 10A-10C illustrate another embodiment for determining a relationship between scattered light intensity and CD change. In this embodiment, a feature 1000 having a line width of approximately the desired CD is surrounded by tiling of dark features (such as squares). The size of the squares of the tiling 1010 can be progressively reduced (thereby reducing the optical density around the critical feature 1000), as shown in FIGS. 10A-10C. The methodologies illustrated in FIGS. 9A-9D and 10A-10C can be implemented either experimentally (by patterning a wafer with the various reticle layouts shown in FIGS. 9A-9D and 10A-10C) or by simulating the patterning thereof using an appropriate simulation tool, as has been described above.

While, in one embodiment, steps 520 and 522 have been described as being performed separately, it is to be appreciated that these steps provide a single relationship (which can be expressed in terms of a lookup table or a suitable curve) between pattern density and CD change.

At step 530, edges of features within the initial reticle layout can be adjusted based on the average density of the sampling window in which the edge is located. As is described above, clear-field features can have their edges moved outward in order to compensate for flare, while dark-field features can have their edges moved inward in order to compensate for flare. Once all of the edges within the reticle layout or pattern have been adjusted appropriately, an OPC corrected reticle data set can be output for photolithographic processing or further data manipulation.

Although the illustrations appended hereto show a specific order of executing functional logic blocks, the order of execution of the blocks can be changed relative to the order shown. Also, two or more blocks shown in succession may be executed concurrently or with partial concurrence. Certain blocks may also be omitted. In addition, any number of commands, state variables, warning semaphores, or messages can be added to the logical flow for purposes of enhanced utility, accounting, performance, measurement, or for providing troubleshooting aids, and the like. It is understood that all such variations are within the scope of the present invention.

Although particular embodiments of the invention have been described in detail, it is understood that the invention is not limited correspondingly in scope, but includes all changes, modifications and equivalents.

What is claimed is:

1. A method of adjusting a reticle layout to compensate for flare, said method comprising:
   determining a localized reticle pattern density across the reticle layout;
   determining a relationship between reticle pattern density and edge adjustment; and
   for a given feature of the reticle layout, adjusting an edge of the feature by a given amount based on the localized reticle pattern density adjacent the given feature.

2. The method of claim 1, wherein the step of determining a localized reticle pattern density includes:
   determining a reticle pattern density within a sampling window of a predetermined size.

3. The method of claim 2, wherein the step of determining a localized reticle pattern density includes:
   stepping the sampling window across the reticle layout.

4. The method of claim 3, wherein the size of the sampling window and the size of the steps between successive samplings have a ratio of about 2:1 to about 10:1.

5. The method of claim 2, wherein the size of the sampling window is determined based on a characterization of the flare.

6. The method of claim 5, wherein characterizing the flare includes:
   providing a plurality of features of a given shape and a decreasing size; and
   progressively exposing the plurality of features to illumination of increasing exposure to determine whether the flare is long-range flare and/or short-range flare.

7. The method of claim 6, wherein the steps of providing a plurality of features and progressively exposing the plurality of features are performed experimentally or via simulation.

8. The method of claim 6, wherein long-range flare includes scattered light that tapers off within a distance of about 5 microns to about 5 millimeters from a bright reticle area; and short-range flare includes scattered light that tapers off within a distance of about 250 nanometers to about 5 microns from a bright reticle area.

9. The method of claim 8, wherein the size of the sampling window is increased if the flare is long-range.

10. The method of claim 1, wherein determining a relationship between reticle pattern density and edge adjustment includes
    determining a relationship between reticle pattern density and scattered light intensity; and
    determining a relationship between scattered light intensity and edge adjustment.

11. The method of claim 10, wherein determining a relationship between scattered light intensity and edge adjustment includes creating a plurality of test patterns, the plurality of test patterns including a dark feature having a desired line width, said dark feature being surrounded by a progressively-shrinking clear region; and measuring changes in the line width of the dark feature as a function of the size of the clear region.

12. The method of claim 10, wherein determining a relationship between scattered light intensity and edge adjustment includes:
creating a plurality of test patterns, the plurality of test patterns including a dark feature having a desired line width;
varying optical density around the dark feature; and
measuring changes in the line width of the dark feature as a function of the optical density around the dark feature.

13. The method of claim 10, wherein determining a relationship between scattered light intensity and edge adjustment includes creating a plurality of test patterns, each test pattern being created by:
providing a dark feature, said dark feature having a desired line width;
surrounding the dark feature by a clear-field box;
surrounding the clear-field box by a dark background;
progressively reducing the size of the clear box; and
measuring changes in the line width of the dark feature.

14. The method of claim 10, wherein determining a relationship between scattered light intensity and edge adjustment includes creating a plurality of test patterns, each test pattern being created by:
providing a dark feature, said dark feature having a desired line width;
surrounding the dark feature by a plurality of regularly-spaced dark boxes;
progressively decreasing the size of the plurality of regularly-spaced dark; and
measuring changes in the line width of the dark feature.

15. The method of claim 1, wherein adjusting the edge of a feature by a given amount includes:
for clear-field features, adjusting the feature edge outward.

16. The method of claim 1, wherein adjusting the edge of a feature by a given amount includes:
for dark-field features, adjusting the feature edge inward.

17. A program embodied in computer-readable medium to correct a reticle layout topology for flare, said program comprising:
code that determines a localized reticle pattern density across the reticle layout;
code that determines a relationship between reticle pattern density and edge adjustment; and
code that, for a given feature of the reticle layout, adjusts an edge of the feature by a given amount based on the localized reticle pattern density adjacent the given feature.

18. The program of claim 17, said program comprising:
code that determines reticle pattern density within a sampling window of a predetermined size; and
code that steps the sampling window across the reticle layout.

19. The program of claim 18, said program comprising:
code that characterizes the flare; and
code that determines the size of the sampling window based on the characterization of the flare.

20. A program storage medium comprising the program as set forth in claim 17.

* * * * *